(12) United States Patent
Arakawa

(10) Patent No.: US 9,263,145 B2
(45) Date of Patent: Feb. 16, 2016

(54) CURRENT DETECTION CIRCUIT AND SEMICONDUCTOR MEMORY APPARATUS

(71) Applicant: Winbond Electronics Corp., Taichung (TW)

(72) Inventor: Kenichi Arakawa, Chiba (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/537,352

(22) Filed: Nov. 10, 2014

(65) Prior Publication Data

US 2015/0228350 A1 Aug. 13, 2015

(30) Foreign Application Priority Data

Feb. 12, 2014 (JP) ................................. 2014-024479

(51) Int. Cl.
*G11C 7/06* (2006.01)
*G11C 16/26* (2006.01)
*G11C 16/04* (2006.01)
*G11C 13/00* (2006.01)
(Continued)

(52) U.S. Cl.
CPC .............. *G11C 16/26* (2013.01); *G11C 7/1051* (2013.01); *G11C 11/2273* (2013.01); *G11C 13/004* (2013.01); *G11C 13/0007* (2013.01); *G11C 16/0483* (2013.01); *G11C 2013/0045* (2013.01); *G11C 2013/0054* (2013.01); *G11C 2213/82* (2013.01)

(58) Field of Classification Search
CPC ................. G11C 7/1051; G11C 7/065; G11C 2013/0045; G11C 11/2273

USPC ....................................................... 365/189.15
See application file for complete search history.

(56) References Cited

U.S. PATENT DOCUMENTS

2004/0057318 A1* 3/2004 Cernea et al. ................. 365/226
2004/0174732 A1* 9/2004 Morimoto ..................... 365/148
2004/0240278 A1* 12/2004 Brady et al. ............. 365/189.09

FOREIGN PATENT DOCUMENTS

JP          10-228792      8/1998
JP         H 11176177 A    7/1999
(Continued)

OTHER PUBLICATIONS

Office Action issued in corresponding Japanese patent application No. 2014-024479 on Mar. 10, 2015.
(Continued)

*Primary Examiner* — Huan Hoang
*Assistant Examiner* — Jay Radke
(74) *Attorney, Agent, or Firm* — Muncy, Geissler, Olds & Lowe, P.C.

(57) ABSTRACT

The invention provides a current detection circuit and a semiconductor memory apparatus using the current detection circuit thereof. The current detection circuit is capable of rapidly sensing the current flowing through a tiny bit line structure. A page buffer/sensing circuit of the invention includes: a transistor TP3 pre-charging a node SNS during a pre-charge period and providing a target constant current to the node SNS during a discharge period; a transistor TN3 pre-charging the bit line according to the voltage pre-charged to the node SNS; and a transistor TP2 connected to the node SNS. The transistor TP2 detects whether or not a current larger than the constant current supplied by the transistor TP3 is discharged from the bit line and outputs a detection result to a node SENSE.

12 Claims, 13 Drawing Sheets

(51) Int. Cl.
*G11C 7/10* (2006.01)
*G11C 11/22* (2006.01)

(56) References Cited

FOREIGN PATENT DOCUMENTS

| JP | 2006-500727 A | 1/2006 |
|---|---|---|
| KR | 10-1998-0071285 A | 10/1998 |
| KR | 10-2004-0079328 A | 9/2004 |
| KR | 10-2005-0084587 A | 8/2005 |
| WO | WO 2004/029975 A1 | 4/2004 |

OTHER PUBLICATIONS

Korean Office Action dated Nov. 12, 2015, as issued in corresponding Korea Patent Application No. 10-2014-0116322 with English translation (9 pages).

* cited by examiner

|  | Erase | Write in | Readout |
|---|---|---|---|
| Selected W/L | 0 | 15V~20V | 0 |
| Non-selected W/L | F | 10V | 4.5 |
| SGD | F | Vcc | 4.5 |
| SGS | F | 0 | 4.5 |
| SL | F | Vcc | 0 |
| P well | 20 | 0 | 0 |

FIG. 4

CURRENT DETECTION CIRCUIT AND SEMICONDUCTOR MEMORY APPARATUS

CROSS REFERENCE TO RELATED APPLICATIONS

This Application claims priority of Japanese Patent Application No. 2014-024479, filed on Feb. 12, 2014, the entirety of which is incorporated by reference herein.

BACKGROUND OF THE INVENTION

1. Field of the Invention

The present invention relates to current sensing, an operation for detecting a current flowing through the bit line, and in particular to a current detection type sense circuit of a semiconductor.

2. Description of the Related Art

FIG. 1 is a diagram showing an example of a bit line selection circuit and a page buffer/sense circuit of a conventional flash memory. Here, a pair of bit lines are illustrated by an even-number bit line GBL_e and an odd-number bit line GBL_o. A bit line selection circuit 10 comprises an even-number selection transistor SEL_e connected to the even-number bit line GBL_e, an odd-number selection transistor SEL_o connected to the odd-number bit line GBL_o, an even-number bias selection transistor YSEL_e connected between the even-number bit line GBL_e and a virtual potential VIR, an odd-number bias selection transistor YSEL_o connected between the odd-number bit line GBL_o and the virtual potential VIR, and a bit line selection transistor BLS connected to a common node N1 of the even-number selection transistor SEL_e and the odd-number selection transistor SEL_o. An NAND string NU is connected between the even-number bit line GBL_e and a common source line SL, and an NAND string NU is connected between the odd-number bit line GBL_o and the common source line SL.

A sense circuit 20 comprises a pre-charge transistor BLPRE for supplying pre-charge potential to the bit lines, a capacitor C connected to a sense node SN that is located between the pre-charge transistor BLPRE and the bit line selection transistor BLS, and a pass transistor BLCD which transfers the potential of the sense node SN to a latch circuit 22.

When the even-number bit line GBL_e is selected and the odd-number bit line GBL_o is unselected, the even-number selection transistor SEL_e and the bit line selection transistor BLS are turned on and the odd-number selection transistor SEL_o is turned off. When the odd-number bit line GBL_o is selected and the even-number bit line GBL_e is unselected, the odd-number selection transistor SEL_o and the bit line selection transistor BLS are turned on and the even-number selection transistor SEL_e is turned off. In this way, one sense circuit 20 is shared by two bit lines GBL_e and GBL_o.

Patent Document 1 discloses the following techniques. Under a readout operation, when the even-number bit line GBL_e is selected, the even-number bias selection transistor YSEL_e is turned off, the odd-number bias selection transistor YSEL_o is turned on, and the odd-number bit line GBL_o is supplied with GND potential by the virtual potential VIR. Conversely, when odd-number bit line GBL_o is selected, the even-number bias selection transistor YSEL_e is turned on, the odd-number bias selection transistor YSEL_o is turned off, and the even-number bit line GBL_e is supplied with GND potential by the virtual potential VIR. In this way, when the even-number bit line is read out, the odd-number bit line will be supplied with GND potential, and when the odd-number bit line is read out, the even-number bit line will be supplied with GND potential. Thereby, bit line shielding is performed to reduce noise due to capacitive coupling of adjacent bit lines.

Patent Document 1: Patent publication no. JP11-176177

The sense circuit 20 shown in FIG. 1 is a so-called voltage detection type sense circuit, which supplies the pre-charge potential to the even-number bit line GBL_e or the odd-number bit line GBL_o via the pre-charge transistor BLPRE and so on, then makes the bit line be discharged in response to the memory state of the selected memory cell, and detects the discharge state at the sense node SN.

However, such voltage detection type sense circuits make it difficult to reduce sensing time when the bit lines become a tiny structure. Namely, as the width or pitch of bit lines gets smaller, the resistance of the bit lines increases and the capacitive coupling between the bit lines also increases, resulting in it taking a long time to pre-charge a constant voltage to the bit lines. In particular, when a shielding readout operation is performed on a bit line, the adjacent bit line is shielded to be at GND potential. Thus, the pre-charge time for a selected bit line becomes longer.

On the other hand, the threshold values of erased memory cells have non-uniformity. Under a readout operation, current flowing through a bit line is not always constant. Therefore, even if a current detection type sense circuit were to be utilized to replace the voltage detection type sense circuit, the ability to determine little current flowing through the bit line would be required.

To solve the above problems, the purpose of the invention is to provide a current detection circuit which can rapidly detect current flowing through a tiny bit line structure. The purpose of the invention is also to provide a semiconductor apparatus having the current detection circuit.

BRIEF SUMMARY OF THE INVENTION

A detailed description is given in the following embodiments with reference to the accompanying drawings.

The invention provides a current detection circuit, including: a first supply circuit, a second supply circuit, and a determination circuit. The first supply circuit can set a current value to be detected and supply constant current corresponding to the current value to a first node. The second supply circuit is connected between the first node and a bit line and can supply the current supplied to the first node to the bit line when the bit line is discharged. The determination circuit is connected to the first node to determine whether or not a current that is larger than the constant current supplied by the first supply circuit is discharged from the bit line.

The invention also provides a semiconductor memory apparatus, including: a memory array formed from a plurality of memory cells; and a sense circuit connected to a plurality of bit lines of the memory array, wherein the sense circuit comprises a plurality of the aforementioned current detection circuits, and each of the current detection circuits is connected to each of the bit lines.

According to the invention, it is possible to rapidly detect current flowing through a tiny bit line structure. Furthermore, in a semiconductor apparatus having a current detection circuit, it is possible to reduce the time on data readout.

BRIEF DESCRIPTION OF THE DRAWINGS

The present invention can be more fully understood by reading the subsequent detailed description and examples with references made to the accompanying drawings, wherein:

FIG. 4 is a table showing an example of bias voltages applied to each part during each operation of the flash memory;

DETAILED DESCRIPTION OF THE INVENTION

The preferred embodiments of the invention will be described. A flash memory and a variable-resistance type memory are used as examples of a semiconductor memory apparatus using a current detection type circuit.

Figure 2:
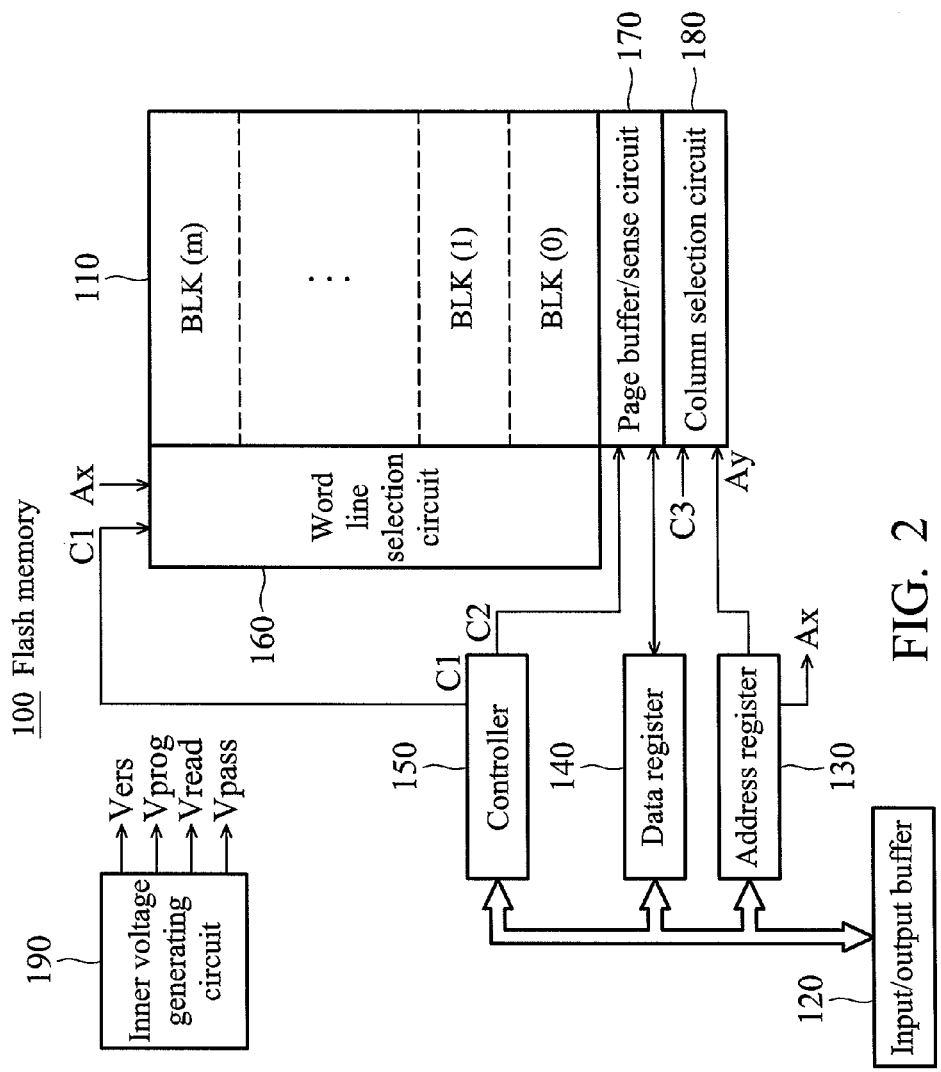
FIG. 2 is a block diagram showing an example of a flash memory in accordance with an embodiment of the invention.

FIG. 2 shows an example of the configuration of a flash memory in accordance with an embodiment of the invention. The flash memory shown here is just an example. The invention is not limited to this configuration. The flash memory 100 of the embodiment comprises: a memory array 110, formed from a plurality of memory cells arranged in rows and columns; an input/output buffer 120, connected to an external input/output terminal I/O and holds input/output data; an address register 130, receiving address data from the input/output buffer 120; a data register 140, holding the input/output data; a controller 150, supplying control signals C1, C2, C3, etc. to control each portion according to command data and external control signals (such as chip enable or address latch enable, which are not shown in Figs) from the input/output buffer 120; a word line selection circuit 160, decoding row address information Ax from the address register 130 and selecting a block and a word line according to the decode result; a page buffer/sense circuit 170, holding the date read out from pages selected by the word line selection circuit 160 and holding the data to be written into pages selected; a column selection circuit 180, decoding column address information Ay from the address register 130 and selecting column data in the page buffer 170 according to the decode result; and an inner voltage generating circuit 190, generating necessary voltages used for reading out, programming, erasing data, etc. (such as a programming voltage Vprog, a pass voltage Vpass, a read pass voltage Vread, an erasing voltage Vers, etc.).

The memory array 110 has a plurality of blocks BLK(0), BLK(1), . . . , BLK(m) arranged in columns. The page buffer/sense circuit 170 is arranged at one side of the blocks. However, the page buffer/sense circuit 170 can also be arranged at the other side of the blocks, or at both sides of the blocks.

Figure 3:
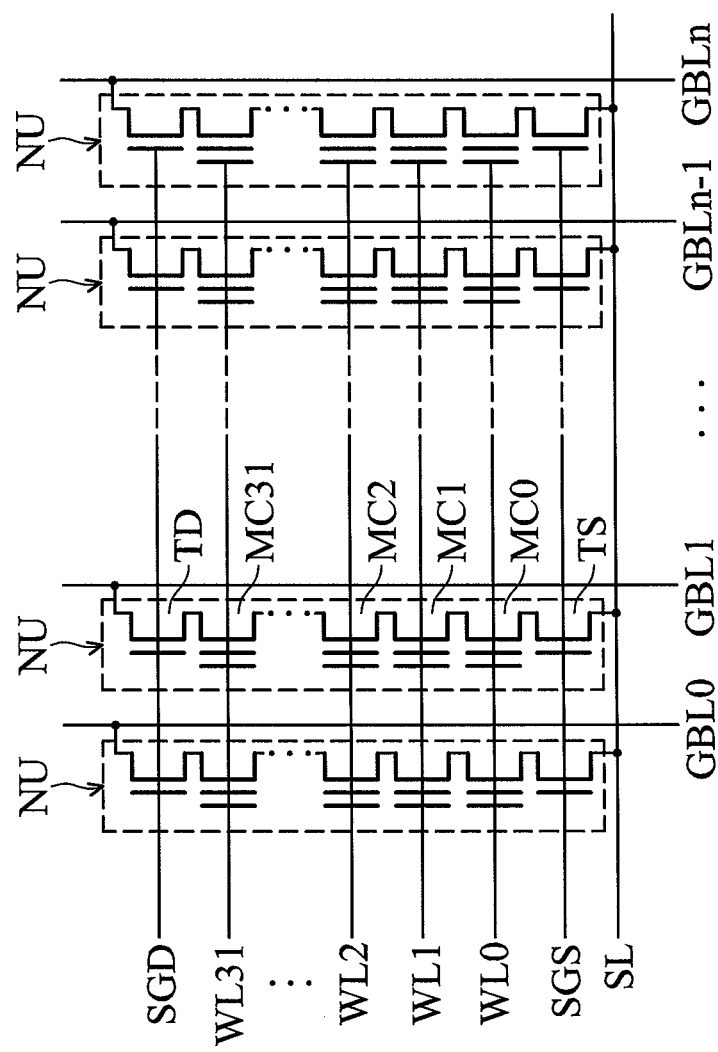
FIG. 3 is a circuit diagram showing the configuration of the NAND strings of the flash memory in accordance with an embodiment of the invention.

As shown in FIG. 3, a memory block is formed from a plurality of NAND string units, and each NAND string unit NU is formed by connecting a plurality of memory cells in series. A memory block has n+1 string units NU arranged in rows. The string unit NU comprises a plurality of memory cell MCi (I=0, 1, . . . , 31) connected in series, a bit line selection transistor TD connected to the drain of the memory cell MC31 located at one end, and a source line selection transistor TS connected to the source of the memory cell MC0 located at the other end. The drain of the bit line selection transistor TD is connected to a corresponding bit line GBL. The source of the source line selection transistor TS is connected to a common source line SL.

The control gate of the memory cell MCi is connected to a word line WLi. The gates of the bit line selection transistor TD and the source line selection transistor TS are connected to the selection gate lines SGD and SGS which are parallel with the word line WL. When selecting a memory block according to the row address Ax, the word line selection circuit 160 selectively drives the bit line selection transistor TD and the source line selection transistor TS via the selection gate lines SGD and SGS of that block.

Typically, the memory cell has a MOS structure comprising: a source/drain which is an N-type diffusion region formed in a P well, a tunnel oxide film formed on the channel between the source and drain, a floating gate (electric charge accumulation layer) formed on the tunnel oxide film, and a control gate formed on the floating gate via a dielectric film. When there is no electric charge accumulated in the floating gate, namely, when data "1" is written in, the threshold value is negative and the memory cell is normally on. When there are electric charges accumulated in the floating gate, namely, when data "0" is written in, the threshold value becomes positive and the memory cell is normally off.

FIG. 4 is a table showing an example of bias voltages applied during each operation of the flash memory. In a readout operation, a positive voltage is applied to the bit line, a voltage (for example, 0V) is applied to the selected word line, a pass voltage Vpass (for example, 4.5V) is applied to the non-selected word line, a positive voltage (for example, 4.5V) is applied to the selection gate lines SGD and SGS, the bit line selection transistor TD and the source line selection transistor TS are turned on, and the common source line is applied with 0V. In a programming (writing-in) operation, a high voltage which is a programming voltage Vprog (for example, 15~20V) is applied to the selected word line, middle potential (for example, 10V) is applied to the non-selected word line, the bit line selection transistor TD is turned on, the source line selection transistor TS is turned off, and the bit line GBL is applied with potential corresponding to data "0" or data "1". In an erase operation, 0V is applied to the word lines selected in a block and a high voltage (for example, 20V) is applied to the P well to pull the electrons in the floating gate to the substrate. Thereby, data is erased in block units.

Figure 1:
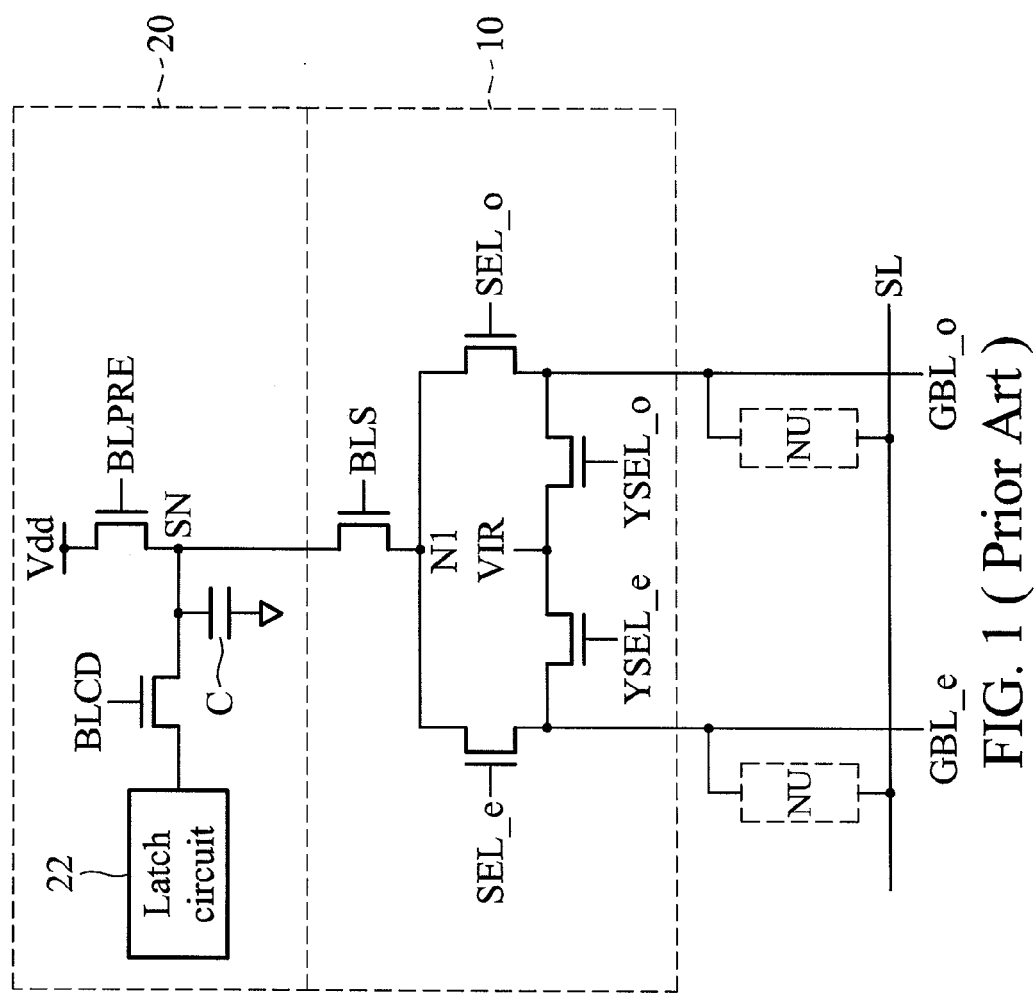
FIG. 1 is a diagram showing an example of a bit line selection circuit and a page buffer/sense circuit of a conventional flash memory.

In a preferred aspect of the embodiment, the flash memory 100 doesn't comprise the bit line selection circuit 10 of the convention flash memory as shown in FIG. 1. Namely, in a readout operation, the flash memory 100 of the embodiment doesn't perform a selection on the even-number bit lines and the odd-number bit lines, but selects all of the bit lines at the same time. Therefore, the page buffer/sense circuit 170 of the embodiment is arranged for all of the bit lines on an one-to-one basis. As shown in FIG. 3, if a block has n+1 bit lines, the page buffer/sense circuit 170 will have n+1 sense amplifier connected to n+1 bit lines.

Figure 5:
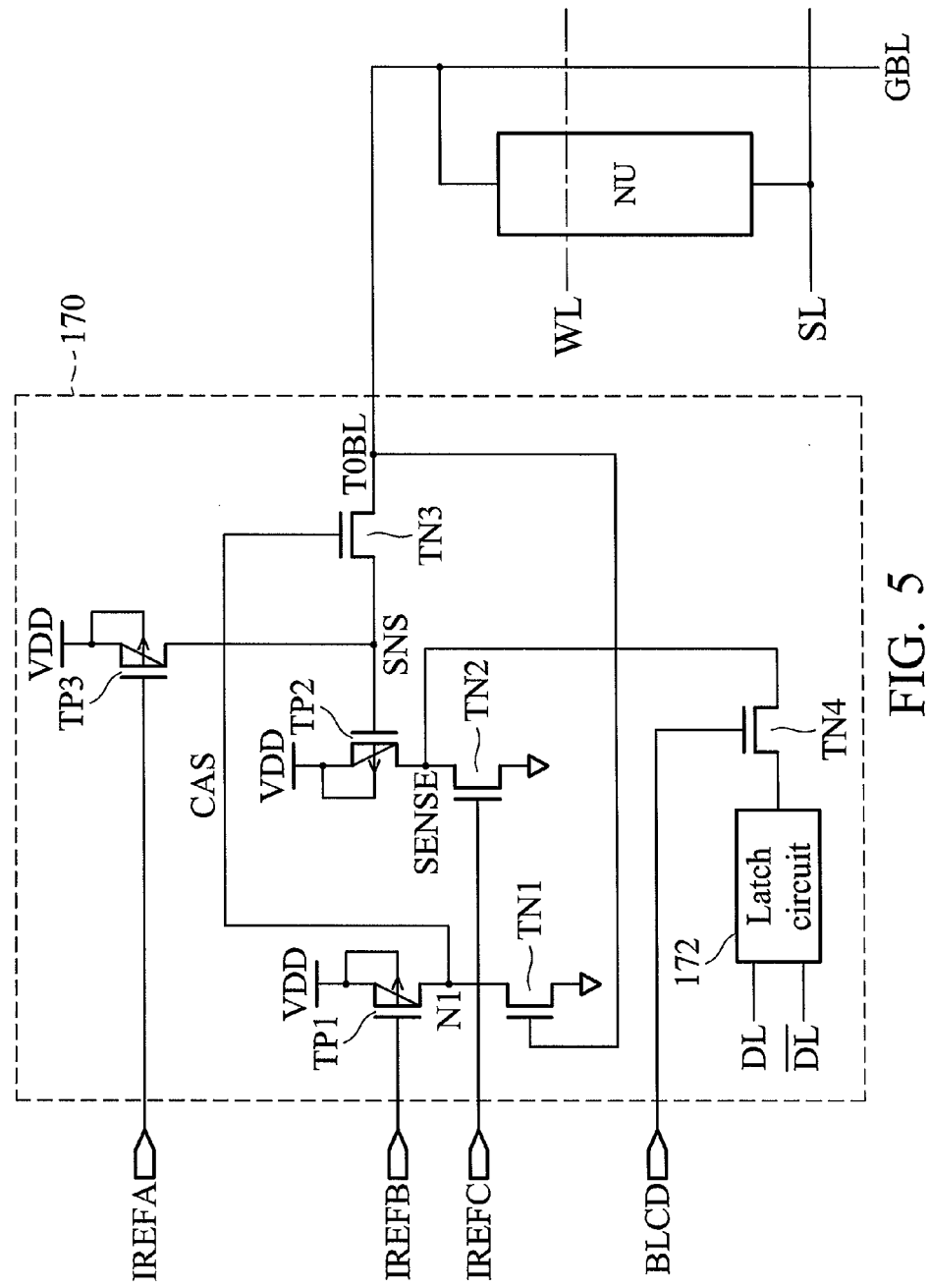
FIG. 5 is a circuit diagram showing the configuration of a page buffer/sense circuit in accordance with an embodiment of the invention.

FIG. 5 shows the page buffer/sense circuit 170 of the embodiment. The page buffer/sense circuit 170 is connected to a bit line. The page buffer/sense circuit 170 comprises a P type MOS transistor TP1 and an N type MOS transistor TN1 connected in series between VDD power (for example, 2V) and reference potential (GND); a P type MOS transistor TP2 and an N type MOS transistor TN2 connected in series between the VDD power (for example, 2V) and the reference potential (GND); a P type MOS transistor TP3 connected between the VDD power (for example, 2V) and a node SNS, an N type MOS transistor TN3 connected between the node SNS and a node T0BL; a pass transistor TN4 connected to a node SENSE; and a latch circuit 172 connected to the pass transistor TN4.

Each gate of the transistors TP1, TN2, TP3, and TN4 receives one of the driving signals IREFA, IREFB, IREFC, and BLCD supplied from the controller 150 to control the operations of the transistors TP1, TN2, TP3, and TN4. A node N1 located between the transistor TP1 and the transistor TN1 is connected to the gate of the transistor TN3. The node T0BL which is connected to the bit line GBL is feedback-connected to the gate of the transistor TN1.

The transistor TP1 functions as a current source which supplies constant current to the node N1 according to a driving signal IREFB. It is preferred that the transistor TP1 sets the gate voltage CAS of the transistor TN3 during the pre-charge period such that a voltage value a little bit greater than the threshold voltage value of the transistor TN3 ($V_{THTN3}+\alpha$ ($\alpha=0.1\sim0.2V$)) is pre-charged to the node T0BL or the bit line GBL. The transistor TP1 further sets the gate voltage CAS during the discharge period so as to allow current $I_{TP3}$ to be supplied by the transistor TP3 which functions as a current source. The transistor TN3 sets a pre-charge voltage of the node T0BL or the bit line GBL during the pre-charge period according to the gate voltage CAS.

In the all-bit-line readout operation, all of the bit lines are charged to the same potential at almost the same time. Thus, the load due to capacitive coupling between bit lines, which is generated when the bit line shielding method is implemented, can be almost ignored. Namely, in the bit line shielding method, the voltage pre-charged to a selected bit line is difficult to be raised because of the GND potential of the adjacent non-selected bit lines. Therefore, in comparison with a bit line shielding method or a voltage detection type circuit, the sense circuit of the embodiment can reduce the pre-charge voltage, and thereby shorten the pre-charge time of the bit lines.

The transistor TP3 is controlled by the driving signal IREFA so as to pre-charge the VDD voltage to the node SNS during the pre-charge period and function as a current source which supplies tiny current $I_{TP3}$ to the node SNS during the discharge period. The current $I_{TP3}$, as described later, determines target current which is detected by the sense circuit.

The gate of the transistor TP2 is connected to the node SNS. During the pre-charge period, the voltage at the node SNS becomes the VDD voltage so as to turn off the transistor TP2. During the discharge period, the voltage at the node SNS corresponds to the potential of the bit line GBL or the node T0BL which is varied in response to the memory state of the selected memory cell. This voltage at the node SNS turns the transistor TP2 on or off. Thereby, the voltage corresponding to data "0" or "1" will appear at the node SENSE. There is a transistor TN2 connected between the transistor TP2 and the ground, the gate of which is supplied with the driving signal IREFC. During the discharge period, the transistor TN2 is driven to an ON state by the driving signal IREFC.

The node SENSE is further connected to the transistor TN4. The gate of the transistor TN4 is supplied with the driving signal BLCD. During the sensing period, the driving signal BLCD is raised to high and the potential of the node SENSE is transferred to the latch circuit 172. The latch circuit 172 holds the data "0" or "1" according to the potential received from the node SENSE, and outputs the data "0" or "1" to the data lines DL and /DL.

The gate of the transistor TN1 is feedback-connected to the node T0BL. The transistor TN1 monitors the voltage of the node T0BL and is turned on or off in response to the voltage of the node T0BL. Specifically, during the discharge period, the voltage of the bit line of the programmed memory cell temporally decreases because of the capacitive coupling with the voltage drop of the bit line of the erased memory cell. Meanwhile, the transistor TN1 is turned off. Because the transistor TN1 is turned off, the voltage CAS at the node N1 is raised and the conductivity of the transistor TN3 is raised. Sensing the bit lines cannot be substantially performed until the voltage of the bit line of the programmed memory cell is restored to the original voltage. This feedback connection shortens the time for restoring the dropped voltage of the bit line of the programmed memory cell. As a result, the time till the sensing operation is shortened.

Figure 6:
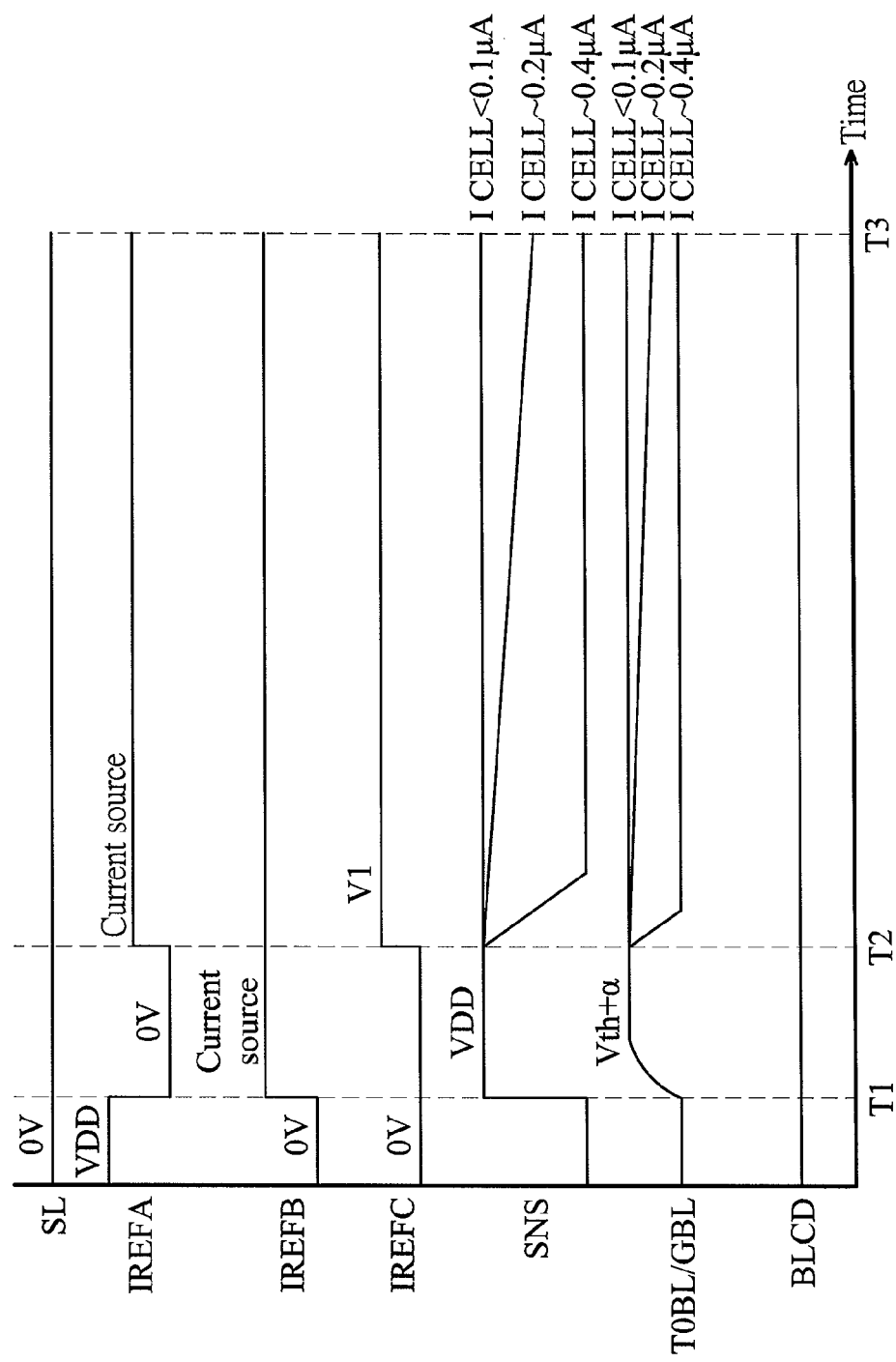
FIG. 6 is a time chart illustrating the operations of the page buffer/sense circuit in accordance with an embodiment of the invention.

Next, the operation of the page buffer/sense circuit of the embodiment is illustrated by referring to the time chart shown in FIG. 6. The controller 150 receives a command for a readout operation or data address via the input/output buffer, and then controls each part to perform the readout operation.

Period T1~T2 is the pre-charge period. The source line is supplied with 0V. The driving signal IREFA is switched from VDD to 0V, the transistor TP3 enters a fully ON state, and the node SNS is pre-charged with the VDD voltage. The driving signal IREFB is switched from 0V to a constant bias voltage at time T1 and the transistor TP1 functions as a current source.

In a preferred example, the current supplied by the transistor TP1 and the current $I_{TP3}$ supplied by the transistor TP3 when they function as a current source are almost the same. At time T1, the voltage at the node T0BL is 0V and the transistor is in the OFF state. Meantime, the CAS voltage supplied to the gate of the transistor TN3 is a value which is able to set a pre-charge voltage $V_{THTN3}+\alpha$ ($\alpha=0.1\sim0.2V$) to the node T0BL or the bit line GBL. Namely, the CAS voltage is set to $2V_{THTN3}+\alpha$. During the period when the voltage between the gate and the source of the transistor TN3 is higher than the threshold voltage of the transistor TN3, the transistor TN3 is turned on and the electric charges pre-charged to the node SNS are transferred to the node T0BL. In this way, the node T0BL and the bit line GBL are pre-charged to a voltage $V_{THTN3}+\alpha$.

When the node T0BL reaches the pre-charge voltage, the transistor TN1 is turned on, and thus the gate voltage CAS is lowered. For example, when the threshold voltage $V_{THTN1}$ is equal to the threshold voltage $V_{THTN3}$, the gate voltage CAS becomes $V_{THTN3}+\alpha$. The transistor TN3 becomes a non-conductive state and the bit line GBL becomes a floating state. During the pre-charge period, the driving signals IREFC and BLCD are 0V, and the transistors TN2 and TN4 are in the OFF state.

Period T2~T3 is the discharge period. At time T2, the driving signal IREFA is changed from 0V to a predetermined bias voltage. During the discharge period, the transistor TP3 functions as a current source supplying current ITP3. The current ITP3 determines the target current that the sense circuit detects. In other words, assuming that the current flowing through an NAND string (the selected memory cell is an erased cell) under the readout operation of a flash memory is ICELL, the current ITP3 will be set to a value which can detect the current ICELL. For example, if the current flowing through an NAND string in which the selected memory cell is an erased cell is about 0.2 μA, the current ITP3 will be set to 0.1 μA. However, the threshold values of erased cells could be uneven. Large current flows through the deeply erased cell, and small current flows through the lightly erased cell. Therefore, the current ITP3 is set to a value which can detect the current of the lightly erased cell.

On the other hand, the word line selection circuit 160 applies 0V to a selected word line in the selected block and a pass voltage (for example, 4.5V) to non-selected word lines. If the selected memory cell is a programmed cell (data "0"), the selected memory cell is not turned on when the selected word line is applied with 0V. Therefore, the NAND string is not conductive, and the voltage at the bit line GBL or the node T0BL is not changed. As a result, the transistor TN3 is not conductive, the voltage at the node SNS is not changed, and the transistor TP2 stays in the OFF state. At time T2, the driving signal IREFC is switched from 0V to a predetermined voltage V1 (V1>$V_{THTN2}$), so the transistor TN2 is turned on, allowing constant bias current to flow through the transistor TN2. For example, the transistor TN2 is set so to allow a bias current which is the same as the current $I_{TP3}$ of the transistor TP3 to flow through the transistor TN2. In this way, the node SENSE is pulled to the GND potential. Therefore, if the transistor TP2 is in the OFF state, the node SENSE will stay at low level.

If the selected memory cell is an erased cell (data "1"), the selected memory cell is turned on because of the read voltage of 0V applied by the selected word line. The NAND string is conductive. Therefore, the electric charges at the bit line GBL or the node T0BL are discharged to the source line SL. In response to the voltage drop of the node T0BL, the voltage between the gate and the source of the transistor TN3 becomes larger than the threshold voltage VT1-ITN3. In this case, the transistor TN3 is conductive and the voltage at the node SNS decreases, but meanwhile the current ITP3 coming from the transistor TP3 is supplied to the node SNS. That is to say, if a current that is larger than the current ITP3 of the transistor TP3 is discharged to the source line SL, the voltage at the node SNS decreases. If current equal to or smaller than the current ITP3 of the transistor TP3 is discharged to the source line, the voltage at the node SNS is unchanged. When the voltage at the node SNS becomes lower than the threshold voltage VTHTP2, the transistor TP2 is turned on and the voltage at the node SENSE is raised to a high level. The voltage at the node SENSE is determined according to the ratio of the transistor TP2 and the transistor TN2.

Figure 7:
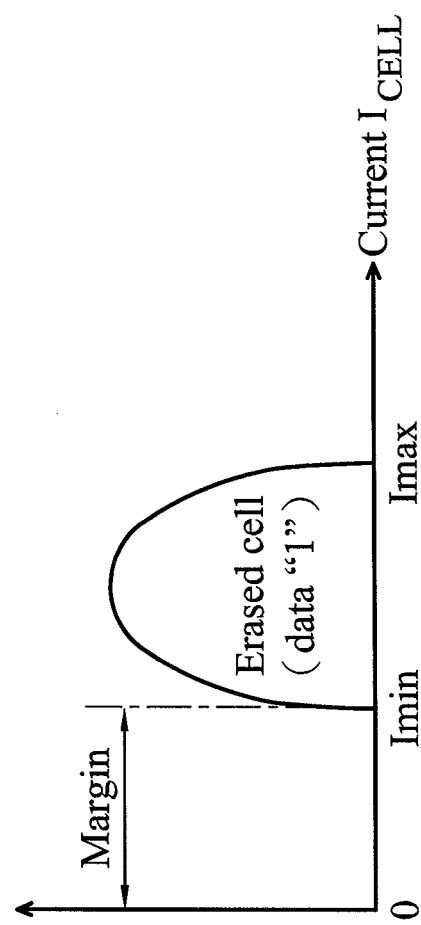
FIG. 7 is a diagram illustrating the relationship between the current $I_{CELL}$, and the target when the selected memory cell is an erasing memory cell.

FIG. 7 shows a distribution of current $I_{CELL}$ of an erased memory cell (data "1"). Because memory cells could be uneven due to the manufacturing process or other reasons, the threshold value of the erased memory cell has a range. The threshold value of the deeply erased memory cell is large and the current $I_{CELL}$ also becomes large. Conversely, the threshold value of the lightly erased memory cell is small and the current $I_{CELL}$ becomes small. On the other hand, during a programming process, there is no current $I_{CELL}$ flowing. As shown in FIG. 7, assuming that the maximum current flowing through the erased memory cell is $I_{max}$ and the minimum current is $I_{min}$, the ideal target current which can be detected by the sense circuit is $I_{min}$. Namely, $I_{TP3}$ is equal to $I_{min}$ ($I_{TP3}=I_{min}$). Thereby, the margin between the erased memory cell and the programmed memory cell can be maximum.

FIG. 6 shows examples where the current $I_{CELL}$ flowing through the NAND string is lower than 0.1 μA, about 0.2 μA, and about 0.4 μA. It is assumed that the current $I_{TP3}$ of the current source transistor TP3 is 0.1 μA ($I_{TP3}=0.1$ μA), $I_{min}$ is greater than 0.1 μA ($I_{min}>0.1$ μA), and $I_{max}$ is equal to 0.4 μA ($I_{max}=0.4$ μA). When the selected memory cell is a programmed memory cell (data "0"), the NAND string is not conductive and the voltages at the node T0BL and the node SNS are not changed. Namely, a waveform that the current $I_{CELL}$ is lower than 0.1 μA corresponds to this case. When the selected memory cell is an erased memory cell and the current $I_{CELL}$ is greater than 0.1 μA and lower than 0.2 μA ($0.1<I_{CELL}<0.2$ μA), the current $I_{CELL}$ which is greater than the current $I_{TP3}$ supplied by the transistor TP3 is discharged, so the voltages at the nodes T0BL and SNS decrease slowly. When the current $I_{CELL}$ of the erased memory cell is equal to or greater than 0.2 μA and lower than 0.4 μA ($0.2 \leq I_{CELL}<0.4$ μA), a noticeably huge current $I_{CELL}$ is discharged, so the voltages at the nodes T0BL and SNS decrease rapidly to 0V. By setting the current $I_{TP3}$ to 0.1 μA ($I_{TP3}=0.1$ μA), a determination can be made as to whether the current flowing through the bit line is greater than 0.1 μA.

Figure 8A:
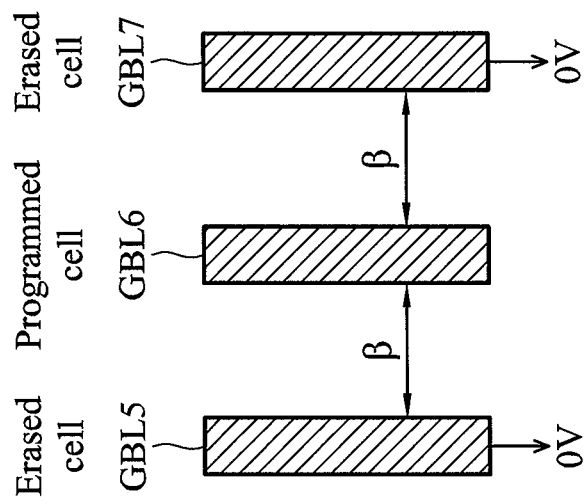
FIG. 8A is a diagram illustrating capacitive coupling between the bit line of the erasing memory cell and the bit line of the programming cell when the discharge is performed.
Figure 8B:
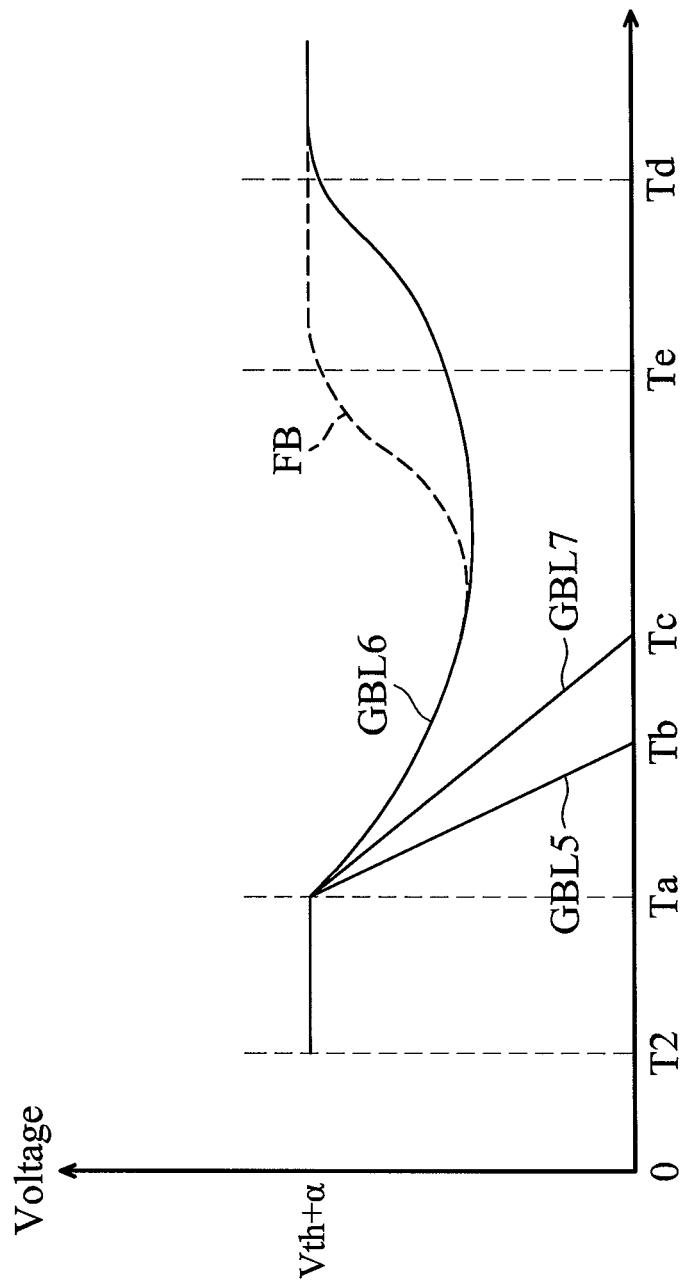
FIG. 8B is a program showing the voltage drop of bit lines of the erasing memory cell and the programming cell.

Next, the feedback control of the transistor TN1 is described. FIG. 8A illustrates capacitive coupling generated between the bit lines of the programmed cell and the erased cell when a discharge is performed. For example, when the selected memory cells of the bit lines GBL5 and GBL7 are erased cells and the selected memory cell of the bit line GBL6 is a programmed cell, the bit lines GBL5 and GBL7 are discharged to the GND potential and the bit line GBL6 isn't discharged to the GND potential. However, if the pitch between the bit lines is about 30 nm, the capacitive coupling β between the bit lines will cause the potential of the bit line GBL6 to go down as the potential of the bit lines GBL5 and GBL7 goes down. This situation is schematically shown in FIG. 8B. At time Ta, the discharge of the bit lines GBL5 and GBL7 begins. At times Tb and Tc, the potential of the bit lines GBL5 and GBL7 respectively becomes the GND potential. The potential of the bit line GBL6 also drops temporarily and is restored to the original potential at time Td.

It should be noted that the programmed cell is off. Therefore, the voltage drop of the bit line GBL6 is not preferred. The reason is that, if the voltage at the bit line GBL6 drops, the voltage at the node SNS may also drop, causing the transistor TP2 to be turned on. The sensing of the node SENSE must be delayed. In other words, the time at which the transistor TN4 transfers electric charges must be delayed, until the time Td when the voltage at the bit line GBL6 is restored. In order to reduce this delay time, the sense circuit of the embodiment makes the voltage at the node T0BL feed back to the transistor TN1 to monitor the voltage at the node T0BL. When the voltage at the node T0BL is lower than the threshold voltage value $V_{THTN1}$, the transistor TN1 is turned off and the gate voltage CAS is raised. Thereby, the impedance of the transistor TN3 decreases, and the current flowing from the node SNS is supplied rapidly to the node T0BL. As a result, as shown by the dotted line FB in FIG. 8B, the potential of the bit line GBL6 is restored at time Te prior to the time Td. Therefore, the sensing time can be set at time Te.

According to the embodiment, by switching the transistor TP3 to control a tiny current source, whether tiny current flows through a tiny bit line structure can be detected. In addition, in the embodiment, by performing the all-bit-line readout operation, the bit line selection circuit used in the prior art for selecting an odd number bit line or an even number line can be omitted. Furthermore, by performing the all-bit-line readout operation, the effect of capacitive coupling between bit lines when the bit lines are pre-charged can be substantially ignored. Therefore, the pre-charge voltage can be lowered and the pre-charge period can be shortened.

Next, the second embodiment is described. The invention has provided an example where the driving signals IREFA and IREFB are used to apply bias voltages to the transistors TP1 and TP3 to make the transistors TP1 and TP3 function as current sources and the driving signal IREFC is applied to the transistor TN2 to make constant bias current flow through the transistor TN2. However, in the second embodiment, a programmable register is provided, which is capable of setting the bias voltages supplied by the driving signals IREFA, IREFB, and IREFC.

Figure 9:
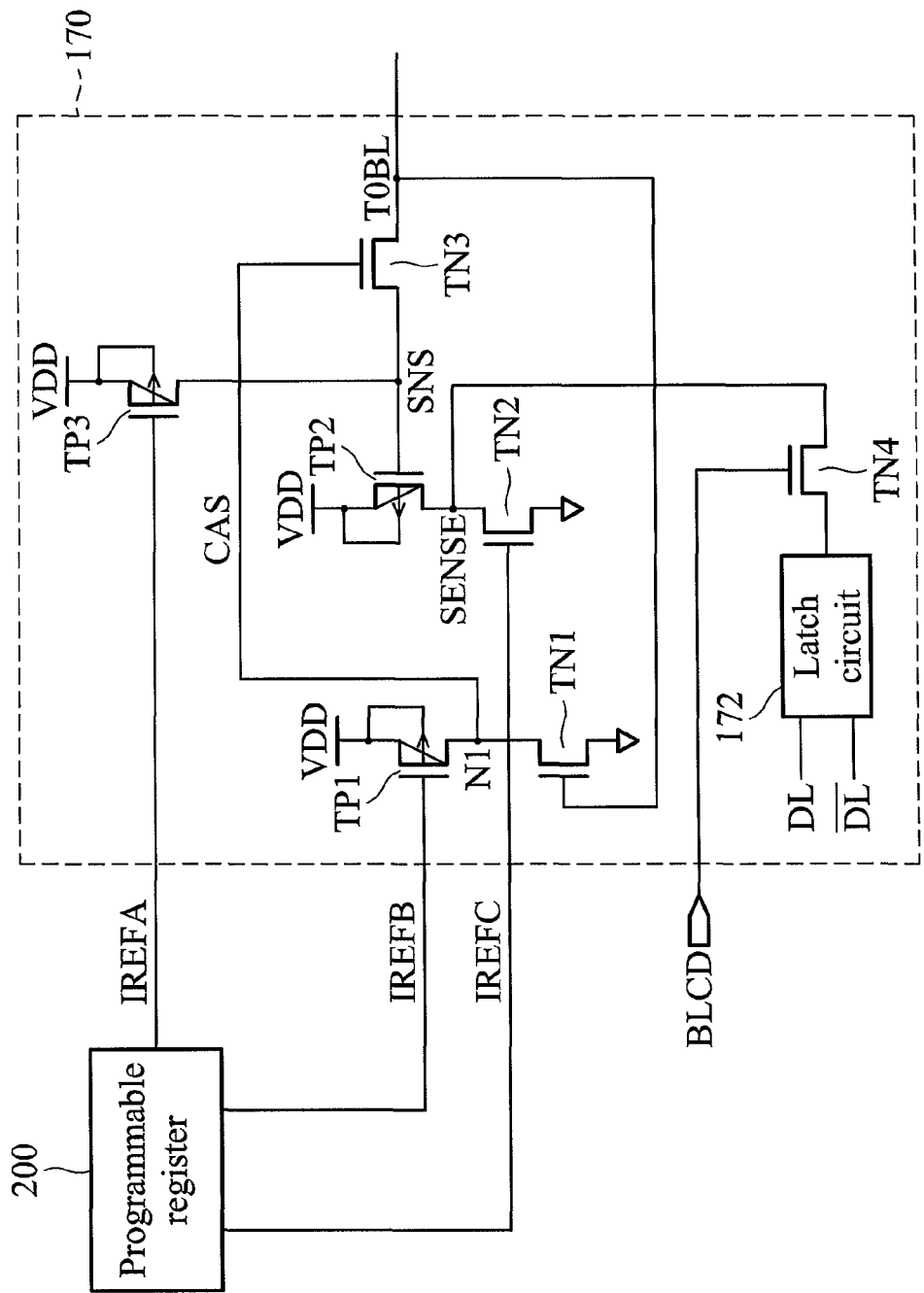
FIG. 9 is circuit diagram showing the configuration of a page buffer/sense circuit in accordance with the second embodiment of the invention.

FIG. 9 shows a page buffer/sense circuit in accordance with the second embodiment. Elements that are the same as those in FIG. 5 will be labeled with the same symbols and their descriptions are omitted. As shown in FIG. 9, a programmable register 200 is provided, which stores data for setting bias voltages. The programmable register 200 comprises, for example, a fuse register or fuse ROM.

Chips in a semiconductor wafer are uneven, so current $I_{CELL}$ flowing through erased cells could also be uneven. Therefore, in the manufacturing process, current $I_{CELL}$ flowing through a selected chip or a test chip is detected. Then fuses in the programmable register 200 are selectively trimmed according to the detection result to set the bias voltages of the driving signals IREFA, IREFB, and IREFC.

Referring to FIG. 9 and FIG. 2, when the controller 150 switches to control tiny current, namely, when the transistors TP1 and TP3 function as current sources, bias voltage setting values set in the programmable register 200 are read out and those setting values are utilized to supply appropriate driving signals IREFA and IREFB to the transistors TP3 and TP1. The driving signal IREFC is also treated in the same way. Thereby, the appropriate target current $I_{TP3}$ can be set to each chip. Meantime, current flowing through the transistors TP1 and TN2 can be optimized.

Figure 10:
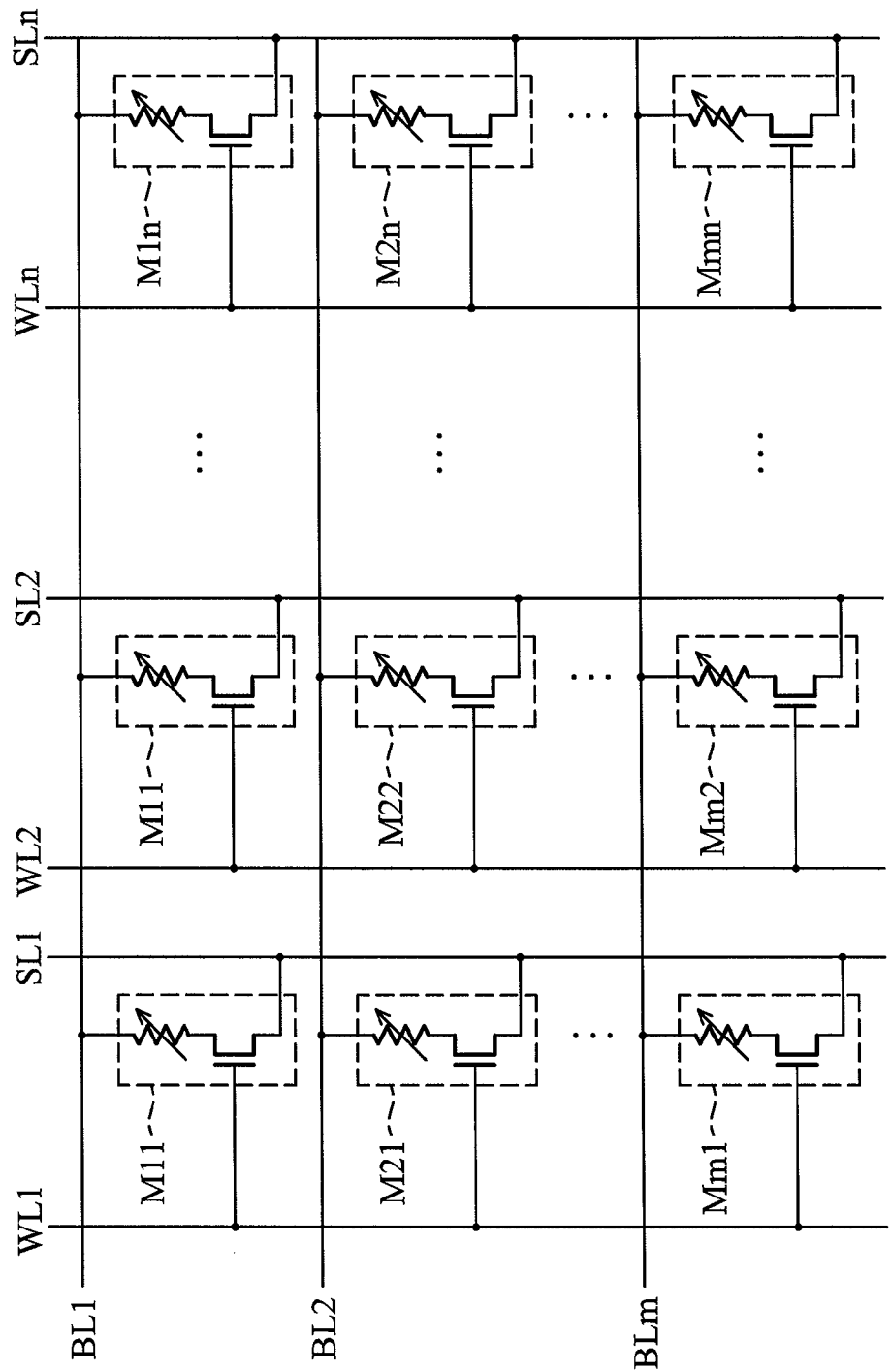
FIG. 10 is a diagram showing an example of a variable-resistance type memory array in accordance with the third embodiment of the invention.

Next, the third embodiment is described. The third embodiment relates to a sense circuit of a variable-resistance type memory. FIG. 10 is a circuit diagram showing a typical structure of the memory array of a variable-resistance type memory. A memory cell is constructed from a variable resistor and an access transistor connected to the variable resistor in series. There are m×n (m and n are positive integers) memory cells forming a two-dimensional matrix. The gate of the access transistor is connected to a word line, the drain region is connected to an electrode located at a side of the variable resistor, and the source region is connected to the source line. The electrode located at the other side of the variable resistor is connected to a bit line.

The variable resistor is formed from thin film of metal oxide such as hafnium oxide ($HfO_x$), the impedance of which can be reversely and non-volatilely set to a low impedance state or a high impedance state by the amplitude and polarity of the applied pulse voltage. Setting (or writing) the variable resistor to the high impedance state is called SET, and setting (or writing) the variable resistor to the low impedance state is called RESET.

Memory cells can be selected in bit units by a word line, a bit line, and a source line. For example, when the memory cell M11 is written, the word line WL1 turns on the access transistor and the bit line BL1 and source line SL1 are applied with voltages corresponding to SET or RESET. Thereby, the variable resistor is set to SET or RESET. When the memory cell M11 is read out, the word line WL1 turns on the access transistor and the bit line BL1 and source line SL1 are applied with voltage for readout. Voltage or current corresponding to SET or RESET of the variable resistor appears on the bit line BL1, and is detected by the sense circuit.

Figure 11:
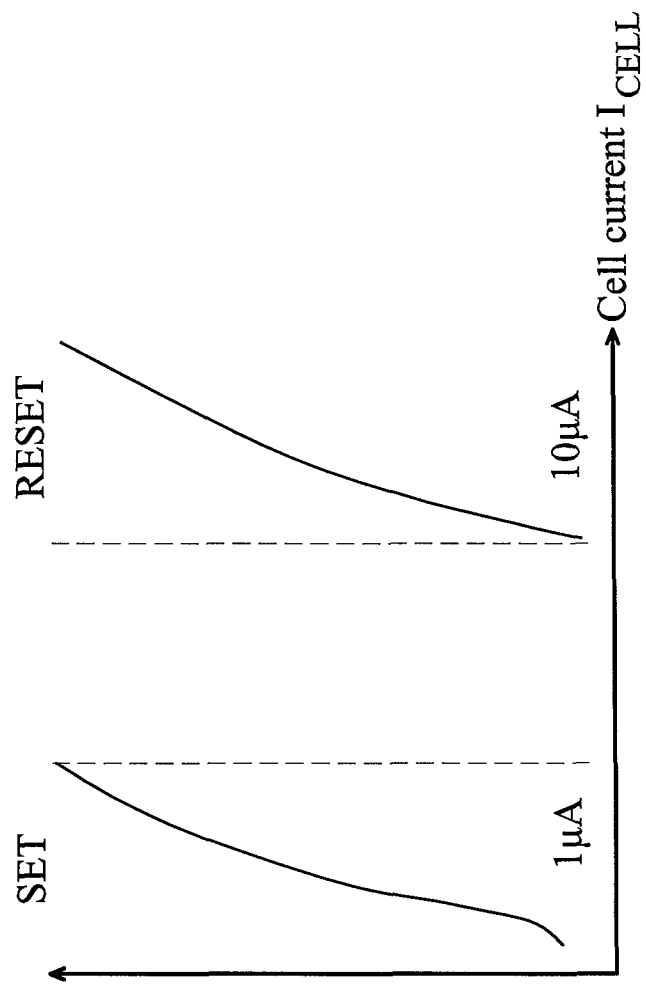
FIG. 11 is a diagram showing the relationship between the flowing current and the distribution when the variable resistor of the variable-resistance type memory is set to SET/RESET.

FIG. 11 shows the relationship between the cell current and the distribution when the variable resistor is set to SET/RESET. Because the variable resistors are uneven, current flowing through the variable resistor which is set to SET or RESET has a range. As shown in FIG. 11, when the variable resistor is set to SET, the variable resistor is switched to the high impedance state and the current flowing through the variable resistor is not greater than 1 µA. On the other hand, when the variable resistor is set to RESET, the variable resistor is switched to the low impedance state and the current flowing through the variable resistor is greater than 10 µA.

Figure 12:
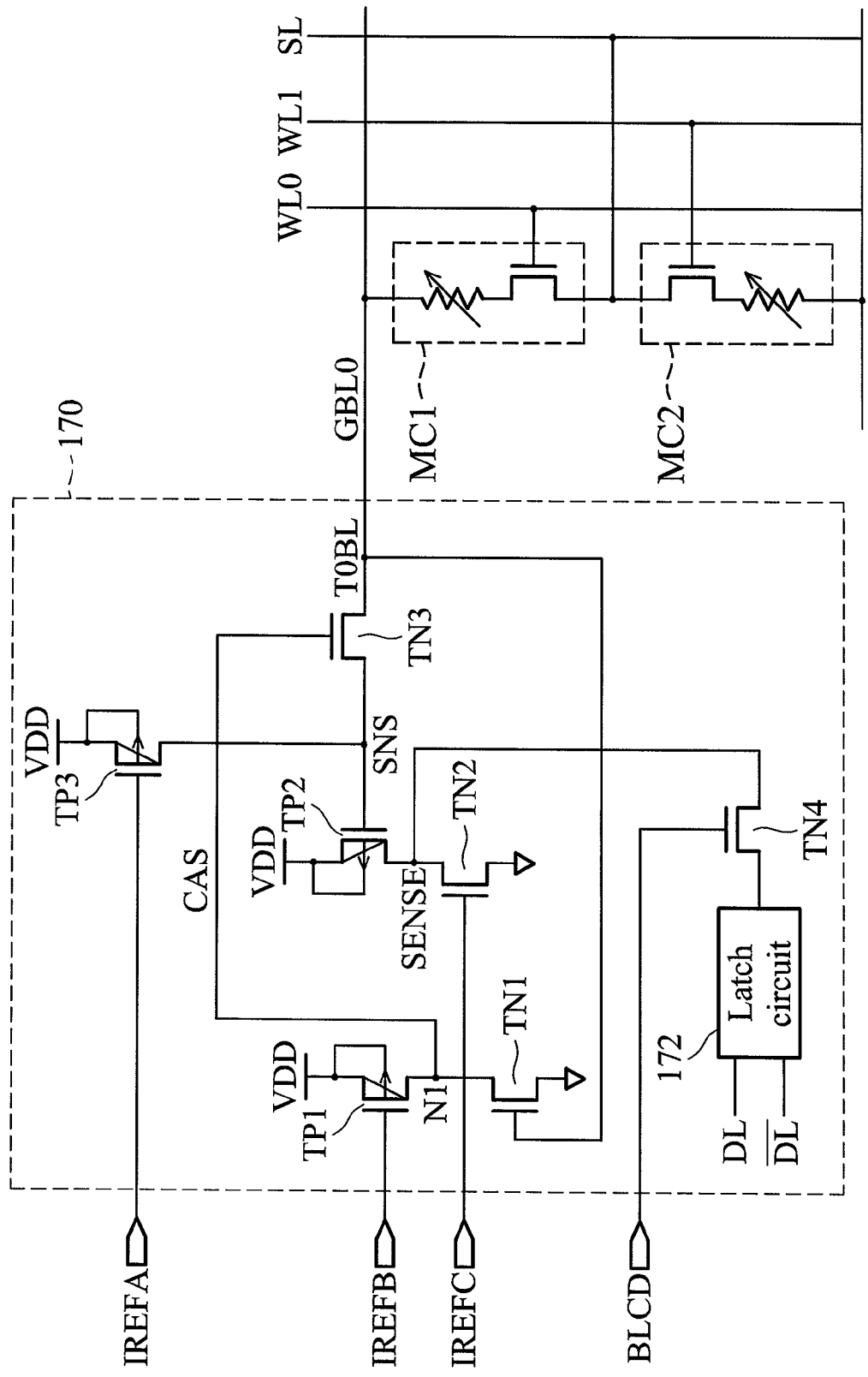
FIG. 12 is a diagram showing a sense circuit of the variable-resistance type memory in accordance with the third embodiment of the invention.

FIG. 12 shows a sense circuit of the variable-resistance type memory according to the third embodiment. Elements which are the same as those in FIG. 5 will be labeled with the same symbols. It is the same as the first embodiment in that, during the period T1~T2, the node SNS, the node T0BL, and the selected bit line GBL0 are pre-charged.

Next, during the period T2~T3, the bit lines are discharged. The transistor TP3 functions as a current source due to the driving signal IREFA and supplies the current $I_{TP3}$. As shown in FIG. 11, the way to determine whether the variable resistor is set to SET or RESET is to determine whether the current flowing through the variable resistor is greater than 1 µA. Therefore, the current $I_{TP3}$ is set to about 1 µA.

On the other hand, a constant voltage is applied to the selected word line to turn on the access transistor. When the variable resistor is set to RESET, the discharge current flowing from the bit line GBL1 to the source line SL via the variable resistor is about 10 µA. The transistor TP3 supplies current of 1 µA to the node SNS, but larger discharge current flows to the source line SL. Thus, the potential of the node SNS is lowered rapidly to a low level, the transistor TP2 is turned on, and the potential of the node SENSE is raised rapidly to a high level. In the sensing period, the transistor TN4 is turned on, the potential of the node SENSE is transferred to the latch circuit 172, and the data corresponding to RESET is outputted.

When the variable resistor is set to SET, the discharge current flowing from the bit line GBL0 to the source line SL via the variable resistor is lower than 1 µA. Meantime, The transistor TP3 supplies current $I_{TP3}$ of 1 µA to the node SNS, so the supply current and the discharge current are balanced. Thus, the potential of the node SNS is not substantially changed. Therefore the potential of the node SENSE is at a low level. In the sensing period, the transistor TN4 is turned on, the potential of the node SENSE is transferred to the latch circuit 172, and the data corresponding to SET is outputted.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current detection circuit, comprising;
   a first supply circuit which can set a current value to be detected and supply a constant current corresponding to the current value to a first node;

a second supply circuit which is connected between the first node and a bit line and can supply the current supplied to the first node to the bit line when the bit line is discharged; and a determination circuit which is connected to the first node to determine whether or not a current that is larger than the constant current supplied by the first supply circuit is discharged from the bit line, wherein the second supply circuit comprises:

a MOS transistor connected between the first node and the bit line; and a monitor circuit monitoring the voltage of the bit line, wherein the monitor circuit reduces the impedance of the MOS transistor when the voltage of the bit line decreases.

2. The current detection circuit as claimed in claim 1, wherein the first supply circuit can further pre-charge the first node, and the second supply circuit pre-charges the hit line by the voltage pre-charged to the first node.

3. The current detection circuit as claimed in claim 1, wherein the determination circuit comprises:

a sense transistor the gate of which is coupled to the voltage of the first node, wherein the sense transistor generates a voltage at a second node in response to the voltage of the first node; and a latch circuit, electrically connected to the second node.

4. The current detection circuit as claimed in claim 1, wherein the first supply circuit comprises:

a programmable memory circuit storing data for setting a current value to be detected, wherein the first supply circuit supplies a constant current to the first node according to the data stored in the programmable memory circuit.

5. The current detection circuit as claimed in claim 1, wherein the first supply circuit comprises:

a MOS transistor connected between the power and the first node, the MOS transistor supplying a constant current to the first node in response to a voltage applied to the gate of the MOS transistor.

6. A semiconductor memory apparatus, comprising a memory array formed from a plurality of memory cells; and a sense circuit connected to a plurality of bit lines of the memory may, wherein the sense circuit comprises a plurality of the current detection circuits as claimed in claim 1, and each of the current detection circuits is connected to each of the bit lines.

7. The semiconductor memory apparatus as claimed in claim 6, wherein the memory array comprises a plurality of NAND strings each of which is formed by connecting the plurality of memory cells in series, wherein each of the current detection circuits is connected to the bit line connected to each of the NAND strings.

8. The semiconductor memory apparatus as claimed in claim 7, wherein when a readout operation of a selected page is performed, the current detection circuit supplies a pre charge voltage to the first node during a pre-charge period and supplies a constant current to the first node during a discharge period.

9. The semiconductor memory apparatus as claimed in claim 7, wherein the constant current supplied by the current detection circuit is set to a value smaller than the minimum value of current flowing through an erase cell of the memory cells.

10. The semiconductor memory apparatus as claimed in claim 7, wherein the current detection circuit comprises a latch circuit for holding a readout result of a selected page.

11. The semiconductor memory apparatus as claimed in claim 6, wherein each of the memory cells is a variable-resistance element storing reversible and non-volatile data, and the current detection circuit is connected to the bit lines connected to variable-resistance elements.

12. The semiconductor memory apparatus as claimed in claim 11, wherein the constant current supplied by the current detection circuit is set to a value which is between a value of current flowing through the variable-resistance element set to SET and a value of current flowing through the variable-resistance element set to RESET.

* * * * *